United States Patent [19]

Devoldere et al.

[11] Patent Number: 5,043,291
[45] Date of Patent: Aug. 27, 1991

[54] METHOD OF MANUFACTURING A BROADBAND HIGH EMISSION POWER SEMICONDUCTOR LASER FROM A BRS TYPE BURIED STRIPE STRUCTURE, AND RESULTING LASER

[75] Inventors: Pascal Devoldere, Lannion, France; Alkis Paraskevopoulos, Berlin, Fed. Rep. of Germany

[73] Assignee: Centre National d'Etudes des Telecommunications, Issy les Moulinbaux, France

[21] Appl. No.: 404,086

[22] Filed: Sep. 7, 1989

[30] Foreign Application Priority Data

Sep. 8, 1988 [FR] France .................. 88 11744

[51] Int. Cl.⁵ ............................ H01L 29/38
[52] U.S. Cl. ........................ 437/24; 437/129; 372/46
[58] Field of Search .......... 437/129, 24; 372/46; 156/606

[56] References Cited

U.S. PATENT DOCUMENTS

| 4,523,961 | 6/1985 | Hartman | 148/1.5 |
| 4,660,208 | 4/1987 | Johnston, Jr. | 372/46 |
| 4,888,624 | 12/1984 | Johnston, Jr. | 357/16 |

FOREIGN PATENT DOCUMENTS 0273730 7/1988 European Pat. Off. .

OTHER PUBLICATIONS

Channeled Substrate Buried Heterostructure InGaAsP-/InP Laser Employing Fe Implant for Current Confinement, Appl. Phy. Lett., 44(3), p. 290.

High Power, Wide-Bandwidth, 1.55 μm Wavelength, p. 944, GaInAsP DFB Laser, Kihara et al., Electronics Letter, 23(18).

High Speed Polyimide-Based Semi-Insulating Planar buried Heterostructures, Elecronic Letters, 23(24), p. 1263.

Primary Examiner—Olik Chaudhuri
Assistant Examiner—Ken S. Kim
Attorney, Agent, or Firm—Blakely, Sokoloff, Taylor & Zafman

[57] ABSTRACT

The present invention concerns a method for manufacturing a buried stripe semiconductor laser comprising the steps of depositing by epitaxy at least the heterostructure (51, 52, 53, 54) comprising at least one active material layer (53) on a substrate (50) and then depositing a dielectric mask (55) over the structure thus obtained and etching the latter through the mask (55) to obtain stripes in the active material layer (53) and any layer or layers (54) previously deposited by epitaxy over the active material layer (53), then carrying out impurity ionic implantation in the structure, protecting the active material stripes (53) and any layer or layers (54) that may have been deposited over this material by means of a mask (55) that is not transparent to ionic implantation.

25 Claims, 3 Drawing Sheets

METHOD OF MANUFACTURING A BROADBAND HIGH EMISSION POWER SEMICONDUCTOR LASER FROM A BRS TYPE BURIED STRIPE STRUCTURE, AND RESULTING LASER

The present invention concerns semiconductor lasers.

Its main object is a method of manufacturing a high emission power broadband semiconductor laser based on a buried ridge stripe (BRS) type structure.

The present invention finds a specific application in optical fibre telecommunications at high data rates over long distances and especially on monomode fibres at a wavelength of 1.3 or 1.55 $\mu$m.

Numerous buried stripe laser structures have already been proposed.

In these structures the active part of the laser is a small rectangular stripe of InGaAsP within which the injected carriers and the laser radiation are confined. The cross-section of the InGaAsP stripe is typically in the order of $0.2 \times 2$ $\mu m^2$.

The general problem that arises is to obtain effective localization of the current from metal contacts towards the buried stripe.

Known buried stripe laser structures can be classified into two categories depending on the current localization technique employed.

In a first category the current is localized by means of a stack of In layers which are alternately of the n and the p type, on either side of the buried stripe, adapted to block the passage of the current into these regions.

The state of the art in respect of this category of lasers is fairly comprehensively described in the document FR-A-2 581 801.

BRIEF DESCRIPTION OF THE DRAWINGS

The appended FIG. 1 shows a typical state of the art structure of this kind. This double channel planar buried heterostructure (DCPBH) structure is described by I. MITO et al in the document Elect. Letters, vol. 18, no 22, (1982), p 953.

Figure 1:
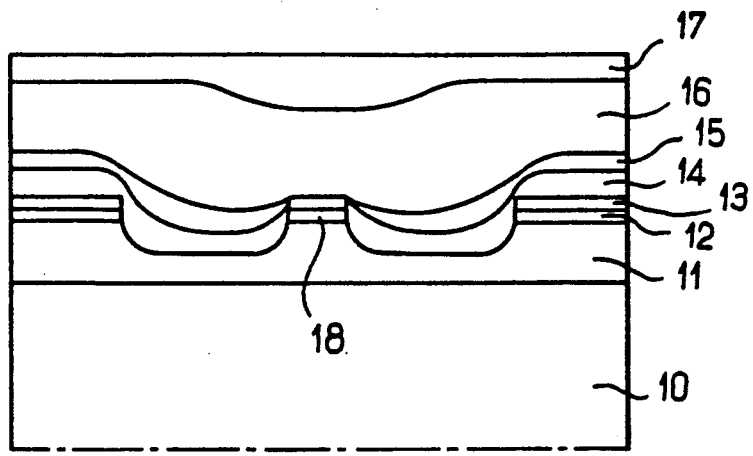
FIG. 1 is a prior art illustration of a double channel planar buried hetero-structure (DCPBH) laser.

The known structure shown in the appended FIG. 1 comprises the following layers:
10: n+ type InP substrate,
11: n type InP confinement layer,
12: InGaAsP layer,
13: p type InP confinement layer,
14: p type InP blocking layer,
15: n type InP blocking layer,
16: p type InP confinement layer,
17: p+ type InGaAsP contact layer.

In FIG. 1 the active InGaAsP region is denoted 18.

The structure shown in FIG. 1 is manufactured by the following process.

A conventional double heterostructure corresponding to the n type InP layer 11, the InGaAsP layer 12 and the p type InP layer 13 is grown epitaxially on the substrate 10 in a first stage.

Stripes in the shape of mesas and corresponding to the active InGaAsP region 18 covered by the p type InP confinement layer 13 are then defined in this double heterostructure.

The p type InP layer 14, n type InP layer 15, p type InP layer 16 and p+ type InGaAsP layer 17 are then grown during a second epitaxial stage, these layers 14 and 15 at least being formed by liquid phase epitaxy.

The electrical confinement is due to the stacked layers 11, 14, 15, 16: n-p-n-p.

With laser structures of the type shown in the appended FIG. 1 a threshold current approaching 10 mA and an emitted optical power in excess of 40 mW are obtained.

Unfortunately, the known structures of the type shown in FIG. 1 have a low bandwidth (2 to 3 GHz). The bandwidth is limited by the spurious capacitances constituted by the current blocking p and n type InP junctions.

In an attempt to improve the bandwidth, K. KIHARA et al have proposed in the document Elect. Letters, vol. 23, no 18 (1987), p 942, to isolate the central part of the laser from the rest of the chip by etches very near and to either side of the buried stripe. However, this solution requires the use of a complex technology.

It will be noted that most structures of the type shown in the appended FIG. 1 are manufactured in two epitaxial stages, or even three in some cases, and that the second epitaxial phase nearly always employs liquid phase epitaxy to planarise the surface.

Figure 2:
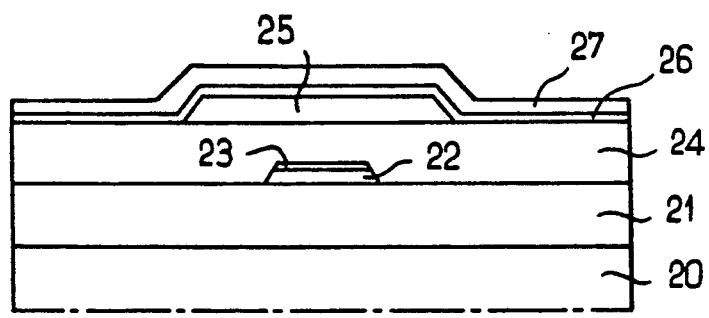
FIG. 2 is a prior art illustration of a buried ridge stripe (BRS) laser.

The appended FIG. 2 shows another type of known structure which can be classified in the second of the aforementioned categories. The structure shown in the appended FIG. 2 is described and shown in FIG. 2 of the document FR-A-2 587 852. The aforementioned document calls this structure the strip buried heterostructure (SBH) structure but in the literature it is more usually called the buried ridge stripe (BRS) structure. It comprises the following layers:
20: n+ type Inp substrate,
21: n type InP confinement layer,
22: InGaAsP layer,
23: InGaAsP guide layer or InPp protection layer,
24: p doped InP layer,
25: GaInAs layer,
26: titanium layer,
27: gold layer.

It is manufactured by the following process.

The InP and InGaAsP layers 21, 22 and 23 are formed on the substrate 20 in a first epitaxial stage.

The InGaAsP layer 22 and the InGaAsP or InP layer 23 are then selectively etched to the required stripe form.

The p doped InP layer 24 and the GaInAs layer 25 are then formed in a second epitaxial phase.

In this structure electrical confinement is procured by a single p-n junction in the InP material forward biased and situated to either side of the active region. This p-n function is formed by the layers 21 and 24. The confinement is due to the positive difference between the diffusion potential of a p-n InP homojunction and the InP n/InGaAsP p laser heterojunction.

This structure makes it possible to obtain a low threshold current in the order of 10 to 15 mA but the emitted optical power is limited to 10 mW (for an emission wavelength of 1.3 μm). Beyond a certain current (typically three to four times the threshold current) the lateral p-n InP homojunctions become conductive because they are forward biased above their diffusion potential. These same junctions constitute spurious capacitances which strongly limit the bandwidth.

An attempt may be made to limit the spurious capacitances and so to improve the bandwidth by implanting protons in the regions to the side of the buried stripe in the layers 24, 26 and 27, as near the stripe as possible. Under these conditions the bandwidth can be as high as 7 to 8 GHz. Proton implantation again requires the use of a relatively complex technology, however. What is more, even after this implantation there remains a non-implanted region to either side of the buried stripe (approximately 2 μm wide on each side) which is the origin of leakage currents beyond three to four times the threshold current.

In the second category the current is localized by the presence of semi-insulative or at least very highly resistive layers to either side of the stripe.

These semi-insulative layers are usually grown by vapour phase epitaxy.

The best performing of these structures is that described by J. E. BOWERS et al in Elect. Letters, vol. 23, no 24, (1987), p 1265. This semi-insulating planar buried heterostructure (SIPBH) structure is schematically represented in the appended FIG. 3.

Figure 3:
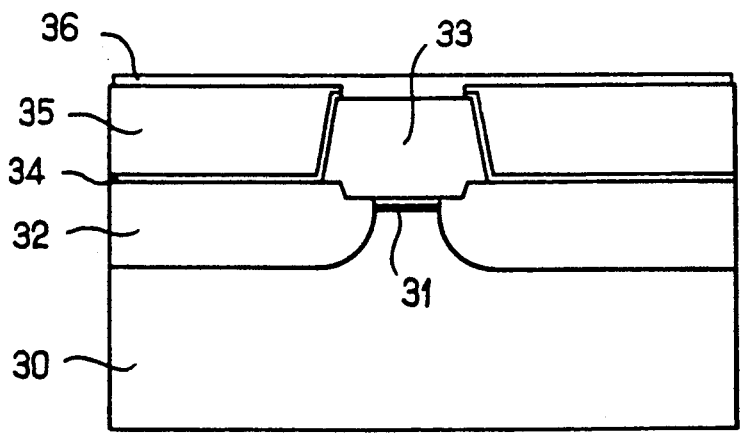
FIG. 3 is a prior art illustration of a semi-insulating planar buried heterostructure (SIPBH) Laser.

The known structure shown in the appended FIG. 3 comprises the following layers:
30: n+ type InP substrate,
31: stripe etched InGaAsP active layer,
32: semi-insulating InP confinement layer to either side of the active layer 31,
33: stripe etched p type InP layer superposed on the InGaAsP active stripe 31,
34: $SiO_2$ layer over the confinement layer 32 and the flanks of the stripe 33,
35: polyimide layer to either side of the stripe 33,
36: covering layer.

The structure shown in the appended FIG. 2 requires three epitaxy cycles and use of a relatively complex technology. This complexity can lead to poor reproducibility and reduce the reliability of the structure.

This known structure makes it possible to obtain a threshold current of 16 to 25 mA, an emitted power of 20 mW and, according to the authors of the aforementioned document, a bandwidth approaching 20 GHz.

Another laser structure comprising semi-insulating layers and therefore belonging to the second of the aforementioned categories is described by D. P. WILT et al in the document Appl. Phys. Lett. 44(3) 1984, p 290. This channel substrate buried heterostructure (CSBH) structure is shown in the appended FIG. 4.

According to the aforementioned document the semi-insulating layer is formed by implanting iron atoms in a n type layer.

Figure 4:
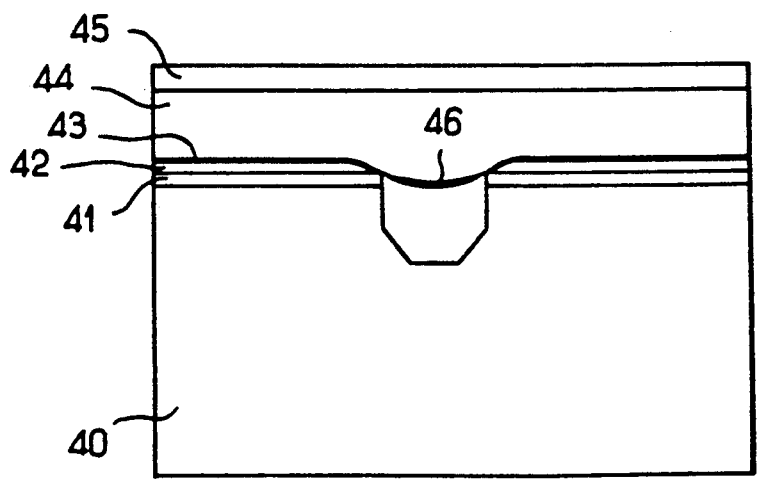
FIGS. 4A-4D are prior art illustrations of making a channel substrate buried heterostructure (CSBH) Laser.

The structure shown in the appended FIG. 4 comprises the following layers:
40: n type InP substrate,
41: Fe-implanted InP confinement layer,
42: n type InP layer,
43: InGaAsp layer,
44: p type InP layer,
45: p type InGaAs layer.

In FIG. 4 the InGaAsP active region is denoted 46.

Figure 4A:
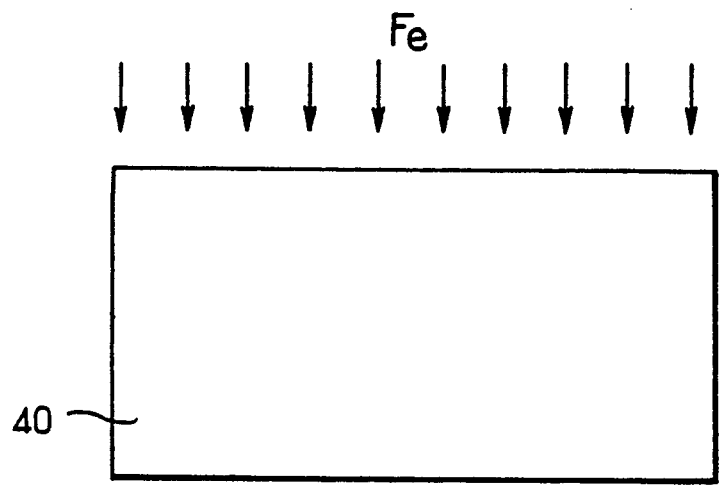
Figure 4B:
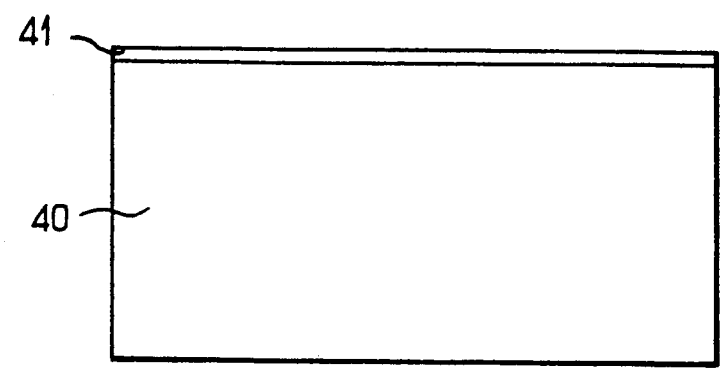
Figure 4C:
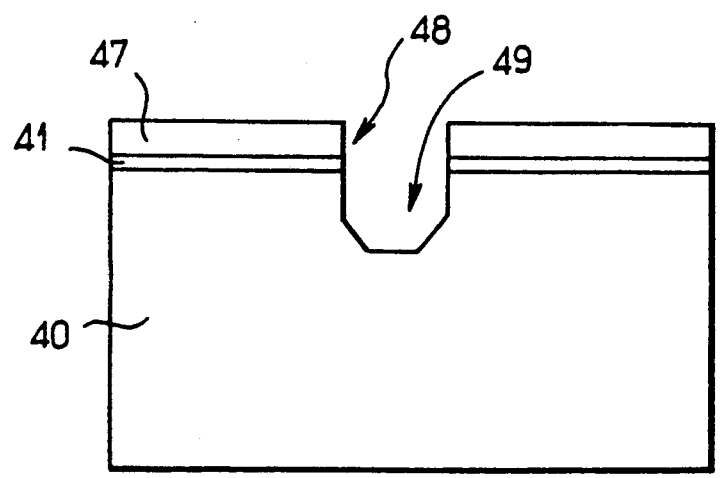

The structure shown in FIG. 4 is formed by the following process schematically represented in FIGS. 4A, 4B and C.

Fe ions are implanted in the n type InP substrate 40 (FIG. 4A) to produce a layer 41 corresponding to the upper layer of the substrate which has a high resistivity (FIG. 4B).

According to the aforementioned document the substrate doping factor is $n = 6 \times 10^{17}$ cm$^{-3}$ and the Fe ions are implanted in two stages with a dose of $1.25 \times 10^{14}$ cm$^{-2}$ at 275 keV and 400 keV respectively.

An $SiO_2$ mask 47 with 2.8 μm wide apertures 48 is placed over the layer 41 for etching with $HCl:H_3PO_4$.

Channels 49 are obtained in the layer 41 and the substrate 40. The structure is annealed at 720° C. for 15 minutes.

A double heterostructure corresponding to the n type InP layer 42, InGaAsP layer 43, p type InP layer 44 and p type InGaAs layer 45 is formed over the layer 41 and the substrate 40 by liquid phase epitaxy.

The n type InP layer 42 is doped with tin.

The InGaAsP layer 43 is not intentionally doped.

The p type InP layer 44 and the p type InGaAs layer 45 are doped with zinc.

Metal (AuZnAu, AuSn and TiPtAu) contact layers are then deposited.

As shown in FIG. 1 of the aforementioned document, page 291, the InGaAsP active region 46 formed over the n type InP layer 42 is generally crescent-shaped.

The passage of current is theoretically blocked by the stacks of n type InP—semi-insulating InP—n type InP layers 40-41-42 formed to either side of the active region 46.

However, only moderate performance is obtained with this structure: threshold current 22 mA, optical power 12 mW.

This moderate performance shows that leakage currents remain to either side of the active region 46 where there are virtually no n type InP—semi-insulating InP—n type InP stacks.

As previously indicated, buried stripe laser structures are not entirely satisfactory.

The disadvantages of the prior art may be summarized as follows:

The first category structures of the DCPBH type (current localisation by stacked p-n-p-n InP layers) have two major disadvantages: on the one hand their manufacture requires the use of liquid phase epitaxy so that they cannot benefit from recent developments in growth techniques such as metal organic vapour phase epitaxy (MOVPE), while on the other hand their modulation performance is mediocre and can only be improved using complex technology (see Elect. Letters vol 23, no. 18 (1987).

The SBH type structure also belonging to the first category suffers from the inability of the p-n InP junction to block the contact beyond a certain bias corresponding to two to four times the threshold current. Its bandwidth is also limited by the spurious capacitances.

Most structures from the second category offer good performance but at the cost of complex technology (among other things, three stages of epitaxy are needed). This complexity can lead to poor reproducibility of their characteristics and reduce their reliability.

This latter structure (CSBH) has the disadvantage that it can only be obtained by liquid phase epitaxy. Moreover, its moderate performance shows that leakage currents remain to either side of the active region, where there are no n type InP—semi-insulating InP—n type InP additions.

An object of the present invention is to improve significantly the injection of carriers and their lateral confinement in the buried stripe by eliminating the forward biased p type InP—n type InP lateral junction in order to eliminate the "shunting" effect of these junctions under steady state conditions and in the presence of modulation without introducing p-n-p-n InP stacks which result in high spurious capacitances and so limit the modulation bandwidth.

It is known that the threshold current, the optical power and the modulation bandwidth are directly dependent on the effectiveness of current localisation.

An auxiliary object of the present invention is to propose a buried stripe laser structure fabrication process which requires only two stages of epitaxy.

These objectives are achieved in the context of the present invention by a process comprising in a manner that is known in itself the following stages:
i) carrying out ionic implantation of an impurity in a material intended to surround the buried active stripe to render this material semi-insulating, and,
ii) depositing by epitaxy at least one heterostructure comprising at least one layer of active material onto the substrate, the method in accordance with the invention being characterised in that it comprises the following steps in the order stated:
a) depositing by epitaxy at least the heterostructure comprising at least the layer of active material onto the substrate, then
b) depositing a dielectric mask onto the structure thus obtained, and
c) etching the latter through the mask to obtain stripes in the layer of active material and any layer or layers previously deposited by epitaxy on the active material layer, then
d) carrying out the ionic implantation of impurity into the structure, protecting the active material stripes and any layer or layers that may have been deposited onto this material using a mask that is not transparent to ionic implantation.

Carrying out the impurity ionic implantation after etching the active material stripe results in a better self-alignment of the confinement layers on the flanks of the stripe than with the prior art technique described in the aforementioned document Appl. Phys. Lett 44(3) 1984, p 290, which teaches carrying out the ionic implantation before deposition of the active material by epitaxy.

In accordance with the invention, the impurity implanted at stage d) is preferably Fe.

In accordance with another advantageous characteristic of the invention the mask used for the impurity ionic implantation step d) is the mask deposited in step b) and used in step c) for the etching operation.

According to another advantageous characteristic of the invention, in step a) a layer of relatively weakly n⁻ doped material is deposited before the active material layer so that the impurity ionic implantation in step d) is effected in this n⁻ doped material layer.

The use of a relatively weakly n⁻ doped material layer specifically adapted to the implantation of impurities makes it possible to use a more strongly doped substrate than in the prior art technique described in the aforementioned document Appl. Phys. 44(3), 1984, p 290.

The present invention is also concerned with a buried stripe semiconductor laser of the type comprising:
a substrate,
an active material region, and
confinement regions to either side of the active material region and rendered semi-insulating by impurity ionic implantation, characterised in that the confinement regions are formed in a relatively weakly n⁻ doped material layer underlying the active material.

Other characteristics, objects and advantages of the present invention will emerge from the following detailed description to be given by way of non-limiting example with reference to the appended drawings in which FIGS. 1, 2, 3, 4, 4A, 4B and 4C illustrate the state of the art as already described; FIGS. 5A through 5E show five successive stages of the process in accordance with the present invention.

The process in accordance with the invention uses two stages of epitaxy. These can be effected with any existing technique: liquid phase epitaxy (LPE), metal organic vapour phase epitaxy (MOVP) or molecular beam epitaxy (MBE).

Figure 5A:
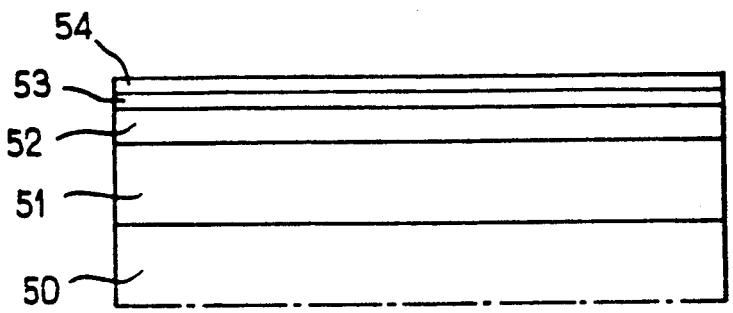
FIGS. 5A-5E are illustrations of intermediate and final structures formed in accordance with the present invention.

The first stage epitaxy schematically represented in FIG. 5A entails growing four layers 51, 52, 53 and 54 onto a substrate 50.

The substrate 50 is advantageously strongly doped n type InP. The doping of the substrate may be typically in the order of $6 \times 10^{18}$ cm$^{-3}$.

The first layer 51 is an n+ type InP buffer layer. Its doping is advantageously in the order of 1 to $3 \times 10^{18}$ cm$^{-3}$. Its thickness is typically in the order of 2 μm.

The layer 52 is one of the important characteristics of the invention. It is formed of relatively weakly doped n⁻type InP. Its doping is advantageously in the order of 1 to $5 \times 10^{17}$ cm$^{-3}$. Its thickness is typically in the order of 0.5 μm. The layer 52 can be thicker than this, however. Its thickness depends on the depth of Fe impurity implantation to which it is subjected later. The thickness of layer 52 must be approximately equal to the Fe impurity implantation depth.

The layer 53 is formed of the non-doped or n doped InGaAsP active material. Its thickness is typically in the order of 0.15 μm.

The layer 54 is a p type InP layer. The doping of the layer 54 is advantageously in the order of 3 to $4 \times 10^{17}$ cm$^{-3}$. Its thickness is typically in the order of 0.2 μm.

After the first stage of epitaxy a narrow stripe is etched into the top two InGaAsP and p type InP layers 53 and 54.

The width of the etched stripes is typically 2 μm.

Figure 5B:
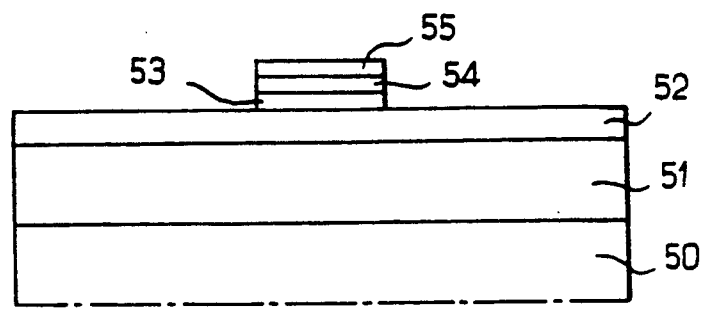

As shown in FIG. 5B a mask 55 is used for the etching, for example an Si$_3$N$_4$ type dielectric mask.

The thickness e of the mask must be sufficient to prevent the iron ions subsequently implanted penetrating into the underlying p InP layer 54.

Figure 5C:
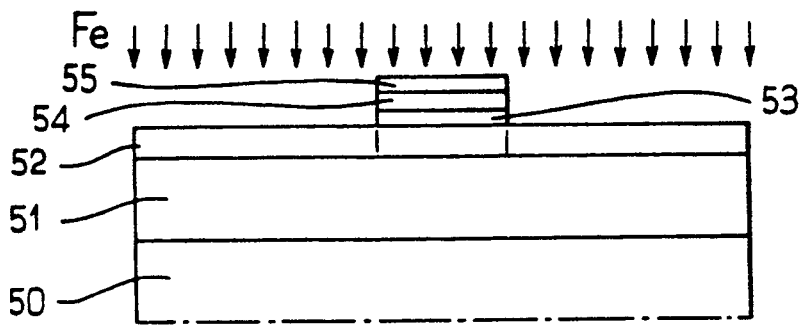

Iron is then implanted over all of the structure as shown schematically in FIG. 5C; this implantation is preferably carried out with the mask 55 previously used to etch the stripe still in place. If necessary, the Fe implantation could be carried out after superposing another mask on the aforementioned structure, care being taken to align carefully the mask and the etched ribbon, however.

The effect of the iron implantation is to render semi-insulating the n⁻type InP layer 52 on either side of the stripe in a self-aligned way, meaning as close as possible to the edges of the stripe. The implantation of iron in the layer 52 is schematically represented by the crosses in the apended figures. For example, the implantation conditions may be as follows: energy 400 keV, dose $10^{13}$ atoms/cm$^2$, temperature 200° C.

The iron implantation is preferably followed by an annealing operation, of fifteen minutes duration at 700° C., for example.

A second stage of epitaxy is then carried out.

Figure 5D:
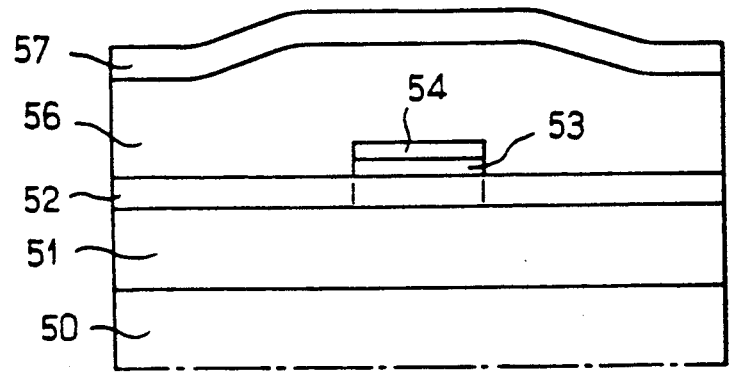

This grows two layers 56, 57 as schematically represented in FIG. 5D.

The first layer 56 is an InP layer that is not intentionally doped. The resulting residual doping will typically be n$^-$ at approximately $5 \times 10^{15}$ cm$^{-3}$. The thickness of the layer 56 is typically 1 to 1.5 µm.

The second layer 57 is an undoped InGaAs layer. The resulting residual doping will typically be n$^{31}$ at approximately $5 \times 10^{13}$ cm$^{-3}$. Its thickness is typically in the order of 0.5 µm.

After the second stage of epitaxy a p type dopant is diffused in a localised way. In this instance it is preferably zinc. This diffusion of zinc is carried out through a mask 58, advantageously made from Si$_3$N$_4$, deposited over the layer 57. The mask 58 incorporates an apperture 59 which must be superposed on the etched stripe (layers 53 and 54).

Figure 5E:
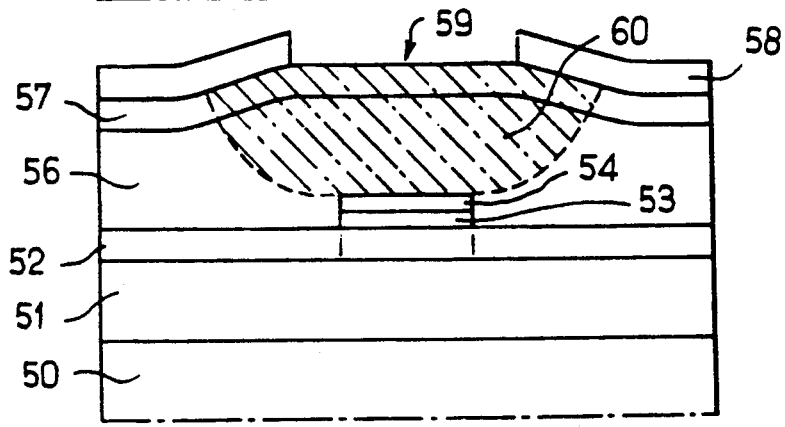

The zinc implantation area 60 is schematically represented in dashed outline in FIG. 5E.

The diffusion of the zinc is controlled in such a way that the area 60 comes into contact with the p type InP layer 54 situated just above the buried InGaAsP stripe 53.

There is obtained in this way a buried stripe semiconductor laser in which the active region 53 is surrounded on each side by semi-insulating InP 52 obtained by implanting iron. As the iron is implanted in the layer 52 after the active region is etched self-alignment of the semi-insulating material on the active regions 53 is guaranteed. The semi-insulating InP material is sandwiched between two weakly n doped InP layers (base of 52 and 56). This stack: InPn$^{31}$ (n≃1 to $3 \times 10^{17}$ cm$^{-3}$)/semi-insulating InP/InPn$^-$ (n≃$5 \times 10^{15}$ cm$^{-3}$) procures very effective confinement when the diode is forward biased by up to 4 V. Moreover, the spurious capacitance introduced by this InPn$^-$/semi-insulating InP/InPn$^-$ structure is low. This makes it possible to achieve a high modulation bandwidth.

As compared with the prior art technique, the laser structure in accordance with the present invention has the following further advantages.

In the process described in Appl. Phys. Lett. 44(3) 1984 p 290 the iron is implanted directly in the InP substrate. The n type doping of this substrate must therefore be as weak as possible for this implantation to be effective. The inevitable result of this is an increase in the access resistance between the n type metal contact and the active region of the laser. According to the aforementioned document doping of the substrate is n≃$6 \times 10^{17}$ cm$^{-3}$.

In accordance with the invention, however, there is provided an n type layer 52 specially adapted to the implantation of iron. This makes it possible to choose weak doping for the implanted layer (n≃$5 \times 10^{17}$ cm$^{-3}$) while retaining a strongly n doped substrate 50 (n≃$6 \times 10^{18}$ cm$^{-3}$). It should be noted that the implementation of this specific implantation layer 52 does not require any additional epitaxy cycle.

The use of a layer 56 that is not intentionally doped makes it possible to optimise the effectiveness of the blocking.

We claim:

1. Method of manufacturing a buried stripe semiconductor laser comprising the steps of:
   i) carrying out ionic implantation of an impurity in a material intended to surround the buried active stripe to render this material semi-insulating, and,
   ii) depositing by epitaxy at least one heterostructure comprising at least one layer of active material onto the substrate,
   the method in accordance with the invention being characterized in that it comprises the following steps in the order stated:
   a) depositing by epitaxy at least the heterostructure (51, 52, 53, 54) comprising at least the layer (53) of active material onto the substrate (50), then
   b) depositing a dielectric mask (55) onto the structure thus obtained, and
   c) etching the latter through the mask (55) to obtain stripes in the layer (53) of active material and any layer or layers (54) previously deposited by epitaxy on the active material layer (53), then
   d) carrying out the ionic implantation of impurity into the structure, protecting the active material stripes (53) and any layer or layers (54) that may have been deposited onto this material using a mask (55) that is not transparent to ionic implantation.

2. Method according to claim 1 characterized in that the impurity implanted in step d) is Fe.

3. Method according to claim 1 characterized in that the mask (55) used in the impurity ionic implantation step d) is the mask deposited in step b) and used in step c) for the etching operation.

4. Method according to claim 1 characterized in that in step a) a relatively weakly n$^-$ doped material layer (52) is deposited before the layer of active material (53) so that the impurity ionic implantation is carried out in step d) in this doped material layer (52).

5. Method according to claim 4 characterized in that the material of the n$^-$ doped layer (52) is InP.

6. Method according to claim 4 characterized in that the doping of the n$^-$ doped material layer (52) is in the order of 1 to $5 \times 10^{17}$ cm$^{-3}$.

7. Method according to claim 4 characterized in that the thickness of the n$^-$ doped material layer (52) is at least 0.5 µm.

8. Method according to claim 4 characterized in that in step a) a buffer layer (51) of n$^+$ doped material is deposited before the layer 52 of n$^-$ doped material.

9. Method according to claim 8 characterized in that the n$^+$ doped material (51) is InP.

10. Method according to claim 8 characterized in that the doping of the n$^+$ doped material layer (51) is in the order of 1 to $3 \times 10^{18}$ cm$^{-3}$.

11. Method according to claim 8 characterized in that the thickness of the n$^+$ doped material layer (51) is in the order of 2 µm.

12. Method according to claim 1 characterized in that the active material (53) deposited in step a) is InGaAsP.

13. Method according to claim 1 characterized in that the active material layer (53) has a thickness in the order of 0.15 µm.

14. Method according to claim 1 characterized in that a layer (54) of p doped material is deposited in step a) after the active material layer (53).

15. Method according to claim 14 characterized in that the p doped material (54) is InP.

16. Method according to claim 14 characterized in that the doping of the p material (54) is in the order of 3 to $4 \times 10^{17}$ cm$^{-3}$.

17. Method according to claim 14 characterized in that the thickness of the p doped material (54) is in the order of 0.2 μm.

18. Method according to claim 1 characterized in that the impurity ionic implantation of step d) is effected with a dose in the order of $10^{13}$ atoms/cm$^2$.

19. Method according to claim 1 characterized in that the impurity ionic implantation in step d) is followed by an annealing step.

20. Method according to claim 1 characterized in that the step d) is followed by a step e) consisting in a second epitaxial stage (56, 57).

21. Method according to claim 20 characterized in that an InP layer (6) that is not intentionally doped is deposited in step e).

22. Method according to claim 21 characterized in that an undoped InGaAs layer (57) is deposited in step e) over the layer (56) of InP that is not intentionally doped.

23. Method according to claim 1 characterized in that it comprises a final step f) involving localized diffusion of a p type dopant (60) over the buried stripes (53, 54).

24. Method according to claim 23 characterized in that the p type dopant (60) is zinc.

25. Method according to claim 23 characterized in that a layer (54) of p doped material is deposited in step a) after the active material layer (53) and in that the localized diffusion of p type dopant (60) contacts the p doped material layer (54) deposited by epitaxy in step a).

* * * * *

UNITED STATES PATENT AND TRADEMARK OFFICE
CERTIFICATE OF CORRECTION

PATENT NO. : 5,043,291
DATED : August 27, 1991
INVENTOR(S) : Devoldere et al.

It is certified that error appears in the above-identified patent and that said Letters Patent is hereby corrected as shown below:

ON THE TITLE PAGE:

[73] Assignee: delete      "Centere National d'Etudes des Telecommunications, Issy les Moulinbaux, France"

insert      --ETAT FRANCAIS represente par le Ministre des Postes, Telecommuications et de l'Espace (Centre National d'Etudes des Telecommunications), Issy les Moulineaux, Frances Signed and Sealed this Sixteenth Day of January, 1996

Attest:

BRUCE LEHMAN

Attesting Officer      Commissioner of Patents and Trademarks

UNITED STATES PATENT AND TRADEMARK OFFICE
CERTIFICATE OF CORRECTION

PATENT NO. : 5,043,291
DATED : August 27, 1991
INVENTOR(S) : Devoldere et al.

It is certified that error appears in the above-identified patent and that said Letters Patent is hereby corrected as shown below:

ON THE TITLE PAGE:

[73] Assignee: delete   "Centere National d'Etudes des Telecommunications, Issy les Moulinbaux, France"

insert   --ETAT FRANCAIS represente par le Ministre des Postes, Telecommunications et de l'Espace (Centre National d'Etudes des Telecommunications), Issy les Moulineaux, Frances This certificate supersedes Certificate of Correction issued January 16, 1996.

Signed and Sealed this

Eighteenth Day of June, 1996

*Attest:*

BRUCE LEHMAN

*Attesting Officer*   *Commissioner of Patents and Trademarks*